United States Patent
Lee et al.

(10) Patent No.: US 6,287,751 B2
(45) Date of Patent: Sep. 11, 2001

(54) METHOD OF FABRICATING CONTACT WINDOW

(75) Inventors: Tzung-Han Lee, Taipei; Li-Chieh Chao, Taoyuan Hsien; Chun-Te Chen, Chungho, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/130,086

(22) Filed: Aug. 7, 1998

(30) Foreign Application Priority Data

May 12, 1998 (TW) .................................... 87107278

(51) Int. Cl.$^7$ ........................................................ G03F 7/00
(52) U.S. Cl. ........................ 430/317; 430/313; 430/315; 216/41
(58) Field of Search .................................. 430/313, 315, 430/317; 216/41

(56) References Cited

U.S. PATENT DOCUMENTS

| 4,814,041 | * | 3/1989 | Auda | 156/643 |
| 5,057,186 | * | 10/1991 | Chew | 156/643 |
| 5,565,384 | * | 10/1996 | Havemann | 437/228 |
| 5,801,094 | * | 9/1998 | Yew | 438/624 |
| 5,897,364 | * | 4/1999 | Pan | 438/563 |
| 5,930,639 | * | 7/1999 | Schuele | 438/396 |
| 5,950,108 | * | 9/1999 | Wu | 438/685 |
| 5,981,352 | * | 11/1999 | Zhao | 438/401 |
| 6,171,951 | * | 1/2001 | Lee | 438/640 |

FOREIGN PATENT DOCUMENTS

| 3914602 | * | 11/1990 | (DE) . |
| 4-296018 | * | 10/1992 | (JP) . |

* cited by examiner

*Primary Examiner*—Mark F. Huff
*Assistant Examiner*—Nicole Barreca

(57) ABSTRACT

A method of fabricating a contact window. On semiconductor substrate having a conductive region, a dielectric layer is formed to cover the substrate and the conductive region. A gettering layer is formed on the dielectric layer. A hard mask layer is formed on the gettering layer. The hard mask layer is patterned to expose a part of the gettering layer which is right on top of the conductive region. The exposed gettering layer and the dielectric layer under the exposed gettering layer are removed to form the contact window.

16 Claims, 2 Drawing Sheets

METHOD OF FABRICATING CONTACT WINDOW

CROSS-REFERENCE TO RELATED APPLICATION

This application claims the priority benefit of Taiwan application Ser. No. 87107278, filed May 12, 1998, the full disclosure of which is incorporated herein by reference.

BACKGROUND OF THE INVENTION

1. Field of the Invention

The invention relates in general to a method of fabricating a contact window, and more particularly, to a method of fabricating a contact window with a chamfered top corner by forming an additional gettering layer and a hard mask layer.

2. Description of the Related Art

Due to the higher and higher integration in an integrated circuit, surface areas on a chip available for forming interconnects become more and more limited. To achieve the electrical connection between electrodes or devices on the chips, a technique of multi-level interconnection was developed and is now commonly used. During the fabrication of a multi-level interconnect, an inter-metal dielectric (IMD) layer is formed between two conductive layers to avoid any unwanted connections. To electrically connect the two conductive or metal layers, a contact window is formed to penetrate through the inter-metal dielectric layer. The contact window is then filled with a conductive layer to form contact via or a contact plug. Another conductive layer is further formed and coupled with the contact via or contact plug. Thus, two conductive layers can be electrically connected with each other by means of the contact via or contact plug.

In FIG. 1A to FIG. 1C, a conventional method of forming a contact window is shown.

In FIG. 1A, an inter-metal dielectric layer 14, for example, a silicon oxide layer formed by chemical vapour deposition (CVD), is formed on a semiconductor substrate which includes a conductive region 12 such as a source/drain region, a gate, or other conductive structures. A photo-resist layer 16 is formed on the dielectric layer 14 with an opening aligned with the conductive region 12. That is, the opening exposes the dielectric layer 14 right on top of the conductive region 12.

In FIG. 1B using a dry etch, the exposed dielectric layer 14 is removed with the photo-resist layer 16 as a mask. A contact window 18 is formed on the modified dielectric layer 14a to expose the conductive region 12.

In FIG. 1C, using sputtering deposition, a glue/barrier layer 20 is formed of, for example, titanium/titanium nitride (Ti/TiN), to enhance the adhesion between a contact via formed subsequently and the contact window 18.

As shown in FIG. 1C, by using this conventional method, a sharp corner 22 is formed on the top edge of the contact window 18. With the sharp corner 22, a poor step coverage is obtained for forming the glue/barrier layer 20. As a consequence, an overhang of the glue/barrier layer 20 is formed at the top corner 22 of the contact window 18. In the subsequent process of forming a contact via or a contact plug, the overhang causes the formation of a void which causes a poor conductivity. A bad contact is caused between the conductive layer 12 and another conductive layer formed thereafter. Therefore the contact via or contact plug cannot form a good electrical connection between the conductive layer 12 and another conductive layer.

Moreover, during the dry etch process to remove the inter-metal dielectric layer 14 and the deposition process for different layers mentioned above, moisture and alkaline metal ions are existent. The moisture and alkaline metal ions easily penetrate through the dielectric layer 14. and therefore, the structures or components under the dielectric layer are damaged and degraded by the penetrated moisture or alkaline metal ions. The quality of the integrated circuit is degraded and the lifetime of the integrated circuit is shortened. Furthermore, during the exposure process for defining the contact window 18, without the formation an anti-reflective layer, an incident light source transmits through the inter-metal dielectric layer 14 and is then reflected by the conductive layer 12 or other metal layers underlying the inter-metal dielectric layer. The reflective light interferes with the incident light source, so that a misalignment is easily caused. Sometimes, the misalignment even causes a blind window. The blind window occurs when photo-resist layer or the inter-metal dielectric layer is not removed completely from the contact window. T he conductive layer within the contact window is thus not exposed at all, and the electrical connection cannot be achieved by the formation of the contact via or contact plug. It is known that the thickness of the dielectric layer is a key factor which affects the critical dimension (CD) in after develop inspection (ADI). If a deviation is introduced due to defocusing or a swing effect of the dielectric layer, an error of critical dimension occurs. In the conventional method, if the photo-resist layer is not thick enough, it is possible that the photo-resist layer is removed while removing the exposed dielectric to form the contact window. Therefore, to be used as a mask layer, the photo-resist layer has to be sufficiently thick to protect the underlying dielectric layer from being etched or removed. However, the thicker the photo-resist layer is, the smaller the tolerance of critical dimension is. Thus, a defocusing phenomenon occurs often.

SUMMARY OF THE INVENTION

It Is an object of the invention to provide a method of fabricating a contact window. By forming an additional gettering layer, the penetration of moisture and alkaline metal ions through the inter-metal dielectric layer are suppressed, so that the underlying structures or components are protected from being degraded.

It is another object of the invention to provide a method of fabricating a contact window without the formation of a blind window. During the exposure process for defining the contact window, an additional hard mask layer blocks an incident light from transmitting through the inter-metal dielectric layer and being reflected by an underlying metal layer. The precision of the exposure process is thus enhanced.

It is yet a further object of the invention to provide a method of fabricating a contact window in which the thickness of the photo-resist layer is reduced, so that the critical dimension (CD) in after develop inspection (ADI) is less affected.

It is a further object of the invention to provide a method of fabricating a contact window with a better step coverage for the subsequent process.

In more detail, before defining the dielectric layer, a gettering layer and a hard mask layer are formed on the dielectric layer in sequence. As a consequence, the penetration of moisture and alkaline metal ions is suppressed by the gettering layer, and a light transmitting through the contact window and reflected by the underlying metal layer is blocked by the hard mask layer. A better step coverage for the subsequent process is obtained by a profile of a chamfering top corner. Therefore, the formation of a blind window is avoided. Furthermore, with the formation of the hard mask layer, the thickness of the photo-resist layer can be reduced. The precision of the subsequent exposure is thus improved.

Both the foregoing general description and the following detailed description are exemplary and explanatory only and are not restrictive of the invention, as claimed.

DETAILED DESCRIPTION

Figure 1A:
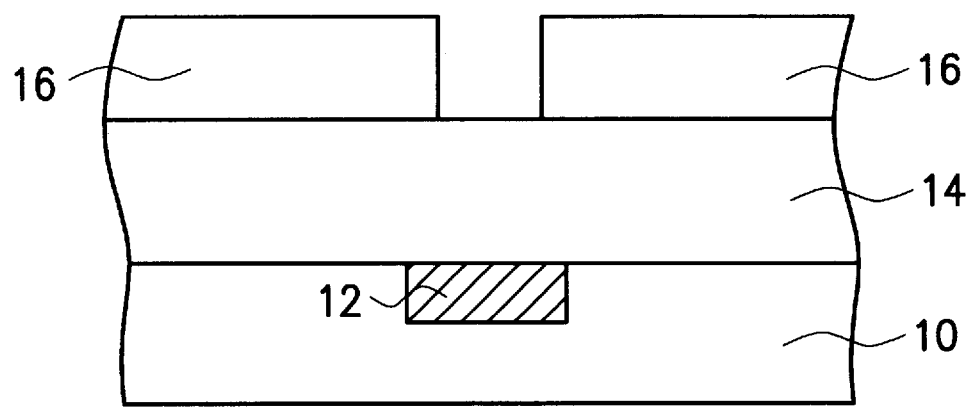
FIG. 1A to FIG. 1C show a conventional method of fabricating a contact window.
Figure 1B:
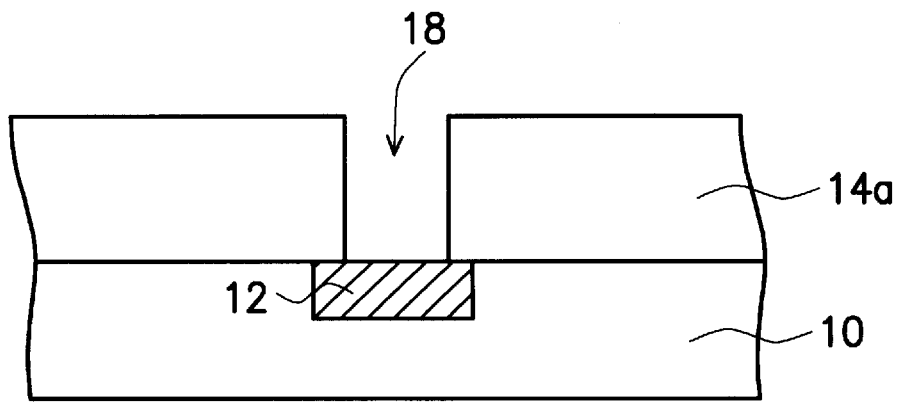
Figure 1C:
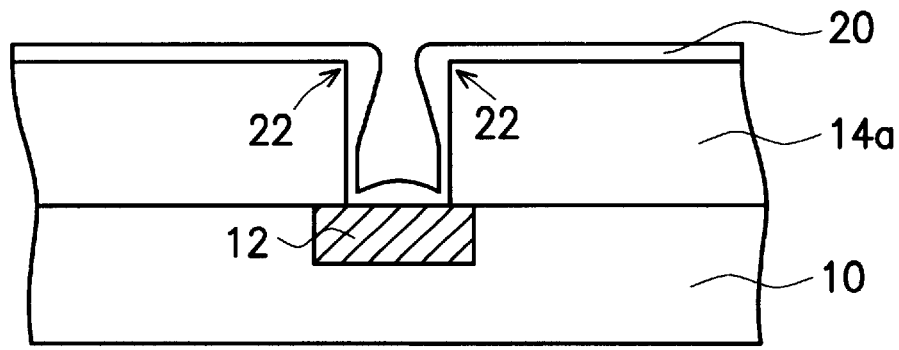
Figure 2A:
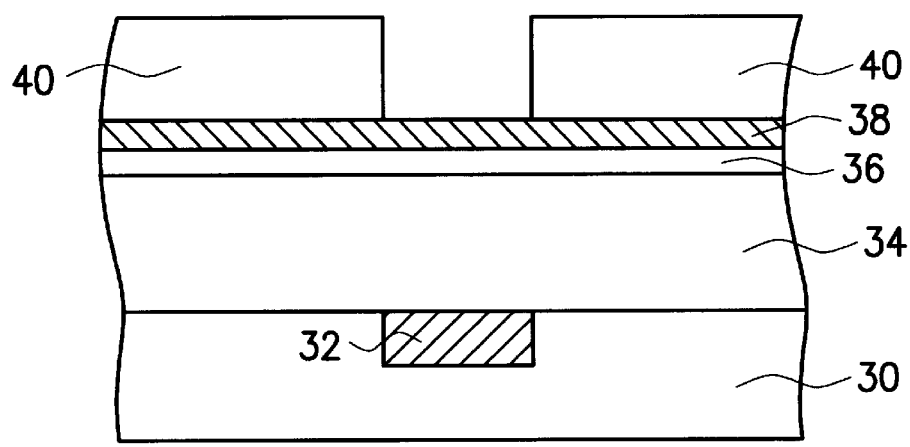
FIG. 2A to FIG. 2C show a method of fabricating a contact window in a preferred embodiment according to the invention.
Figure 2B:
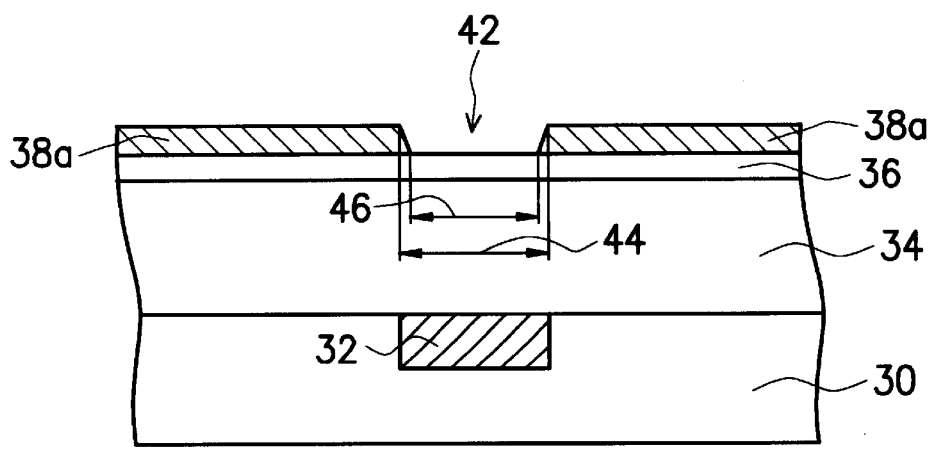
Figure 2C:
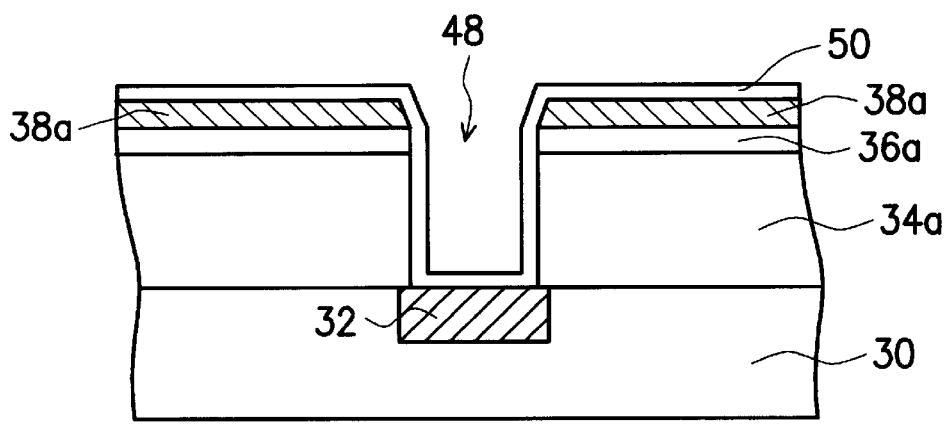

In FIG. 2A to FIG. 2C, a method of fabricating a contact is shown. The contact window is formed for fabricating a contact plug to electrically connect different electrode or conductive layers. As mentioned above, an inter-metal dielectric layer is commonly formed and used to avoid unwanted connections between electrodes such as source/drain regions or gates, or other conductive structures. Since the electrodes or conductive structures are isolated by the inter-metal dielectric layer, an electric connection among the electrodes or conductive structures has to rely on other connection paths such as a contact via or a contact plug.

In FIG. 2A, an inter-metal dielectric layer 34, for example, a silicon oxide layer formed by chemical vapour deposition is formed on a semiconductor substrate 30 which includes a conductive region 32 such as a source/drain region or a gate of a metal-oxide semiconductor (MOS), a poly-silicon line, a conductive wiring, or other conductive structure or layer. A gettering layer 36 is then formed on the dielectric layer 34. The material of the gettering layer 36, such material includes, for example, phosphosilicated glass (PSG) formed by plasma enhanced chemical vapor deposition (PECVD), is selected to absorb moisture and reduce the penetration of alkaline metal ions. The gettering layer 36 is used so that any structures or devices such as the gates, source/drain region of MOS, and other conductive structures underlying the dielectric layer 34 are not degraded by penetrated moisture or alkaline ions. The lifetime of an end product of the substrate 30, an integrated circuit, is thus prolonged. A hard mask layer 38 is advantageously formed on the gettering layer 36. The hard mask layer 38 is formed of a material which is non-transparent and low reflectivity, for example, titanium nitride formed by reactive sputtering. The reflectivity of the hard mask layer 38 is low that when the a light is incident on the hard mask layer 38, the intensity of the light reflected by the hard mask layer 38 is substantially zero. Because of layer 38, any incident light is blocked from transmitting through hard mask layer 38 and being reflected by the underlying conductive region 32. In the subsequent exposure process for defining a contact window, an improved alignment precision is obtained over the prior art, largely because there is reduced interference from reflected lights. A photoresist layer 40 is then formed and defined on the hard mask layer 38. and a part of the hard mask layer 38 which is right on top of the conductive region 32 is exposed.

In FIG. 2B, using the photo-resist layer 40 as a mask, a dry etch is performed to remove the exposed hard mask layer 38, so that an opening 42 exposing a part of the gettering layer 36 right on top of the conductive region 32 is formed. The remaining hard mask layer is denoted as 38a. With the protection of the hard mask layer 38, while forming the opening 42 by etching, or in a subsequent process of etching, there is no worry of etching the underlying dielectric layer 34. The hard mask layer 38 protects against undesired etching. Compared to the conventional method, the photo-resist layer 40 can be formed with a smaller thickness. Therefore, a larger tolerance of the critical dimension is obtained. Another remarkable feature of the hard mask layer 38 is that a taper profile is obtained after being etched. As shown in the figure, instead of having a sharp top corner of the opening 42, a chamfered corner or a tapered profile is obtained. More specifically, the tapered profile has a wider top 44 and a narrower bottom 46. T he photo-resist layer 40 is then removed.

Referring to FIG. 2C, using the hard mask layer 38a as a mask, the exposed gettering layer 36 and the dielectric layer 34 underneath are removed to form a contact window 48, so that the conductive region 32 is exposed. Subsequent processes for forming a via plug are then performed. For example, forming a conformal glue/barrier layer 50, for example, a titanium/titanium nitride layer, on the contact window 48, with metal layer being formed on the glue/barrier layer 50. Because of the top widening opening 42, the glue/barrier layer 50 and metal layer can be formed with an improved step coverage. The formation of an overhang of glue/barrier layer 50, or a void within the metal layer is suppressed.

In the invention, before forming a photo-resist layer to define the contact window, a gettering layer and a hard mask layer is formed sequentially on the inter-metal dielectric layer. With the formation of the gettering layer, moisture and alkaline metal ions introduced by subsequent etching or deposition process are absorbed instead of penetrating through the inter-metal dielectric layer. Compared to the conventional method, the structures underlying the inter-metal dielectric layer are protected from being degraded by the moisture and alkaline metal ions. The lifetime of an integrated circuit is prolonged. When a light source is incident for defining the contact window, the light is blocked by the hard mask layer from transmitting through the hard mask layer and being reflected the underlying conductive region. Since the light cannot transmit through the inter-metal dielectric layer and be reflected by the underlying conductive layer, without interference from the reflected light, a high alignment precision is obtained.

Furthermore, a remarkable feature of etching the hard mask layer is that the contact window has a tapered profile. Compared to the conventional method, a smoother corner is formed at top edge of the contact window, so that a better step coverage for the subsequent deposition is obtained. The void or bad contact in the conventional method is thus improved by the method according to the invention.

During the etching process for forming the contact window, the hard mask layer is used as a mask. With the protection of the hard mask layer, the underlying inter-metal dielectric is not removed or etched away even if the photo-resist layer has been removed. Therefore, the thickness of the photo-resist layer can be formed with a less thickness compared to the conventional method. With a thinner thickness of the photo-resist layer, the ADI CD is less affected. A blind window is thus prevented from being formed.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a contact window to a conductive region on a semiconductor substrate, comprising the steps of:

forming a dielectric layer to cover the substrate and the conductive region;

forming a gettering layer on the dielectric layer;

forming a hard mask layer on the gettering layer, wherein the mask layer is not-transparent and has low reflectivity;

patterning the hard mask layer to expose a part of the gettering layer which is aligned over the conductive region, wherein the hard mask layer is patterned to have a chamfered corner; and removing the exposed gettering layer and the dielectric layer under the exposed gettering layer to form the contact window to the conductive region using the hard mask layer with the chamfered corner as a mask, wherein a sidewall of the contact window is tapered at a top part of the sidewall and is vertical at a bottom part of the sidewall.

2. The method according to claim 1, wherein the conductive region comprises a source/drain region.

3. The method according to claim 1, wherein the conductive region comprises a gate region.

4. The method according to claim 1, wherein the conductive region comprises a poly-silicon line.

5. The method according to claim 1 wherein the dielectric layer comprises a silicon oxide layer.

6. The method according to claim 1, wherein the gettering layer is made of material which can absorb at least one of moisture and alkaline metal ions.

7. The method according to claim 1, wherein the gettering layer comprises a phosphosilicate glass layer.

8. The method according to claim 1, wherein the hard mask layer comprises a titanium nitride layer.

9. The method according to claim 1, comprising the further steps of:

forming a conformal glue/barrier layer on a surface of the contact window; and forming a contact via/plug in the contact window.

10. A method of forming a contact window to a conductive region of a semiconductor substrate, comprising the steps of:

forming a dielectric layer on the substrate;

forming a gettering layer on the dielectric layer;

forming a hard mask layer on the gettering layer; wherein the mask layer is nontransparent and has low reflectivity;

forming an opening in the hard mask layer to expose the gettering layer right on top of the conductive region, wherein a chamfered corner is formed on a side of the hard mask layer adjacent to the opening; and removing the exposed gettering layer and the dielectric layer under the exposed gettering layer to form the contact window using the hard mask layer with the chamfered corner as a mask, wherein a sidewall of the contact window formed in the gettering layer and the dielectric layer is vertical.

11. The method according to claim 10, wherein the gettering layer comprises a phosphosilicate glass layer.

12. The method according to claim 10 wherein the hard mask layer comprises a titanium nitride layer.

13. The method according to claim 10, wherein the contact window has a profile which includes a wider top and a narrower bottom of the contact window.

14. The method according to claim 10, wherein a profile of the contact window has a chamfered top corner.

15. A method of forming a contact window, comprising:

providing a semiconductor substrate having a conductive region;

forming a dielectric layer on the substrate;

forming a gettering layer on the dielectric layer;

forming a titanium nitride layer on the gettering layer;

forming an opening with a tapered profile through the titanium nitride layer to expose the gettering layer, the opening being, aligned over the conductive region; and deepening the opening to expose the conductive region using the titanium nitride layer with the tapered profile as a mask, wherein the deepened opening has a vertical sidewall.

16. The method according to claim 15, comprising the further step of forming a contact via/plug in the opening.

* * * * *